US007010777B1

(12) United States Patent
Hutton et al.

(10) Patent No.: US 7,010,777 B1
(45) Date of Patent: Mar. 7, 2006

(54) SHARED LOOKUP TABLE ENHANCEMENTS FOR THE EFFICIENT IMPLEMENTATION OF BARREL SHIFTERS

(75) Inventors: Michael Hutton, Mountain View, CA (US); Andy L. Lee, San Jose, CA (US); Rahul Saini, Union City, CA (US)

(73) Assignee: Altera Corporation, San Jose, CA (US)

( * ) Notice: Subject to any disclaimer, the term of this patent is extended or adjusted under 35 U.S.C. 154(b) by 1 day.

(21) Appl. No.: 10/807,360

(22) Filed: Mar. 22, 2004

(51) Int. Cl.
*G06F 17/50* (2006.01)

(52) U.S. Cl. .............................. 716/19; 716/12; 716/16; 716/17; 326/41

(58) Field of Classification Search ............ 326/38–41; 716/12, 16, 19
See application file for complete search history.

(56) References Cited

U.S. PATENT DOCUMENTS

| 6,288,568 | B1 | 9/2001 | Bauer et al. |
| 6,297,665 | B1 | 10/2001 | Bauer et al. |
| 6,323,682 | B1 | 11/2001 | Bauer et al. |
| 6,798,240 | B1 * | 9/2004 | Pedersen ............... 326/39 |

* cited by examiner

*Primary Examiner*—Vibol Tan

(74) *Attorney, Agent, or Firm*—Beyer Weaver & Thomas, LLP

(57) ABSTRACT

Additional circuitry is provided over a shared-LUT logic circuit to allow functions of different input characteristics to share a logic element which was conventionally illegal. More restrictive circuitry may be provided over a shared-LUT logic circuit to allow functions with particular input characteristics.

15 Claims, 10 Drawing Sheets

Shared Lookup-Table Mapping
Circuitry with Additional Input

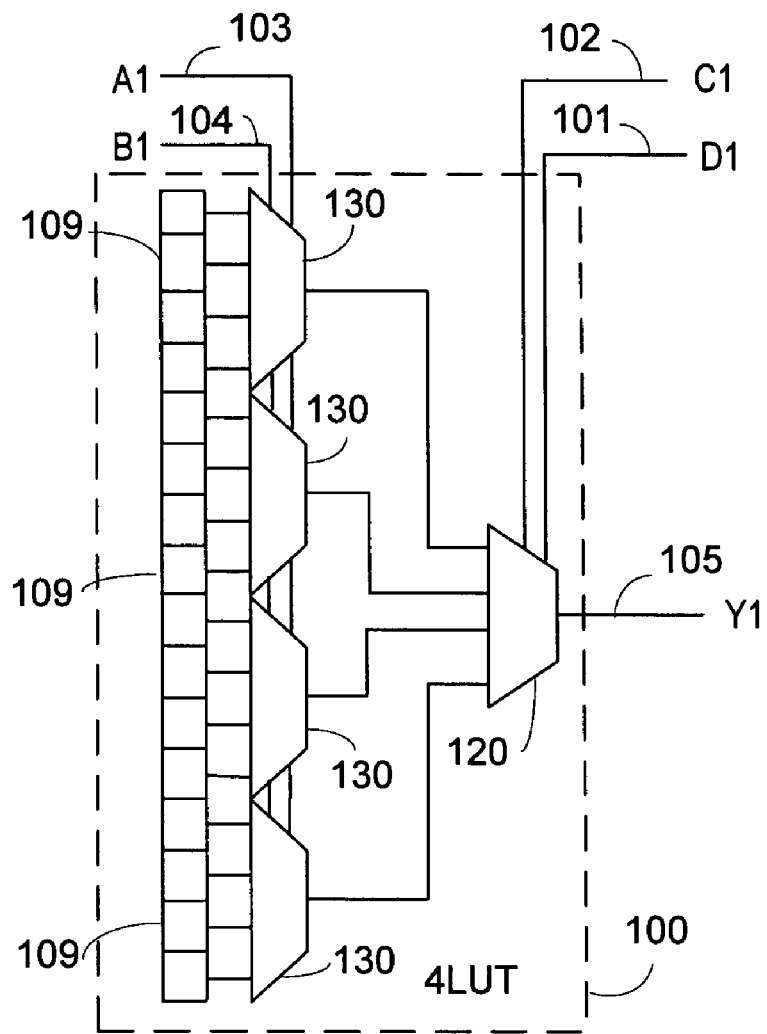
FIG. 1. Lookup Table and LUT Mask

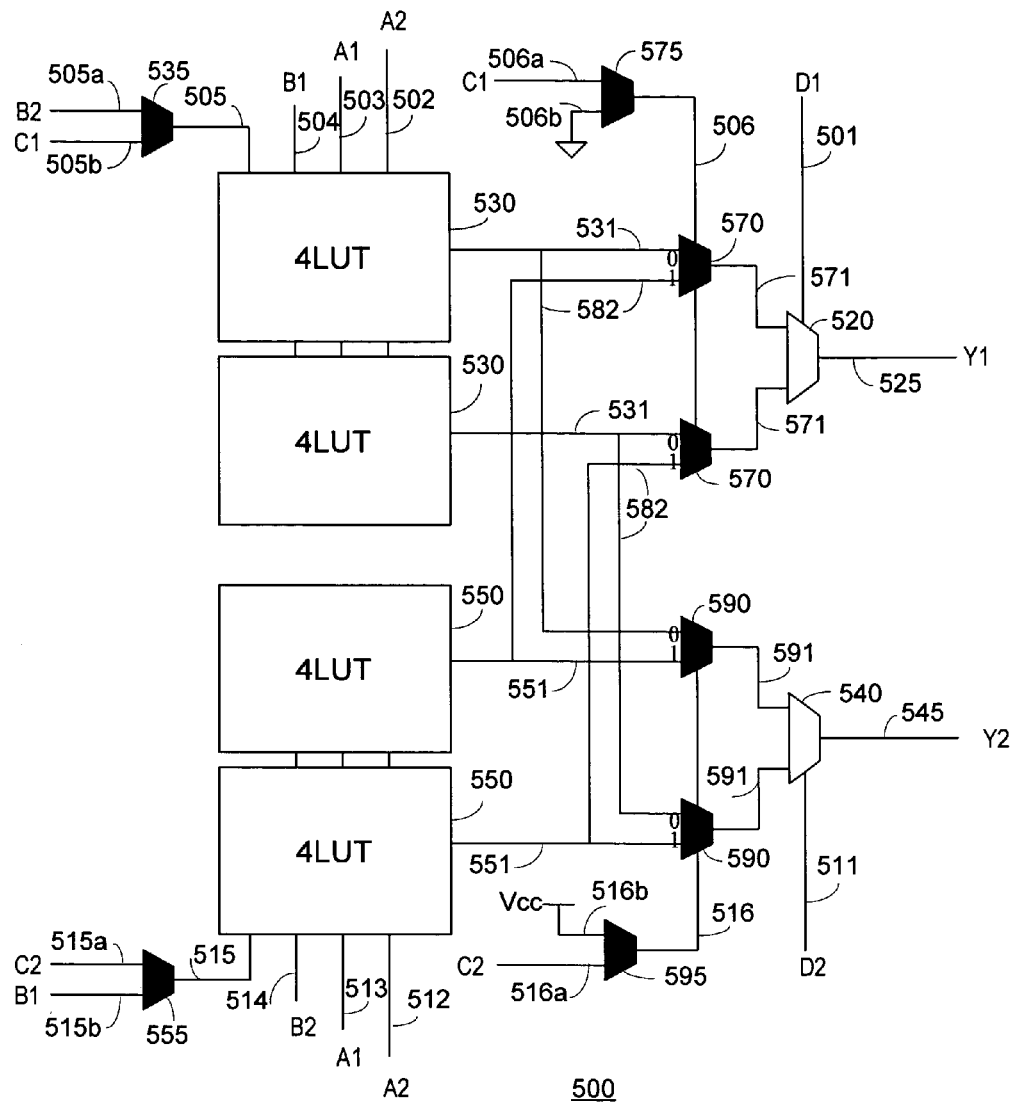
FIG. 2. Shared Lookup-Table Mapping Circuitry

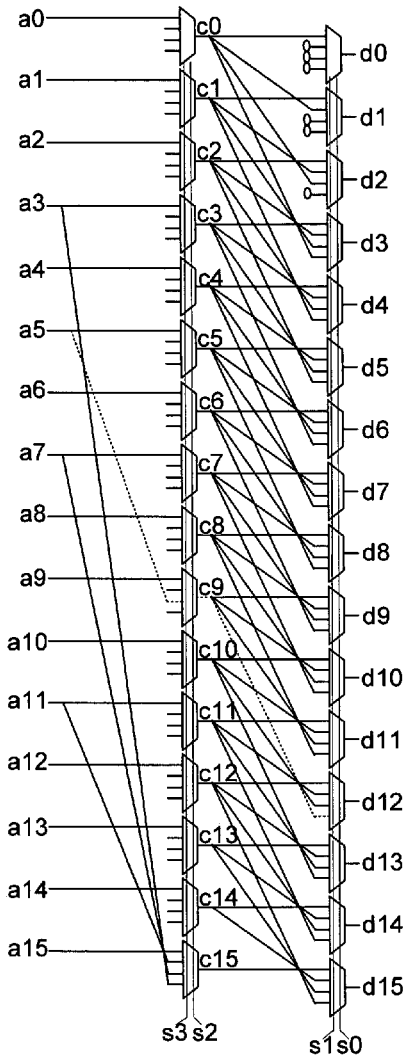
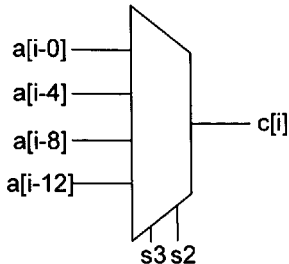
FIG. 3b. Generalized Stage 1
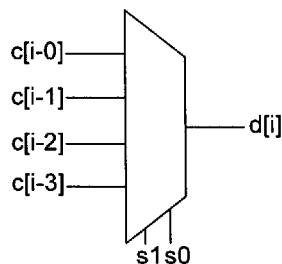
FIG. 3c. Generalized Stage 2
Example: When {s3,s2,s1,s0} = {0111} stage 1 reaches back 4 bits, and stage 2 reaches back 3 bits for a total of 7. Thus the output is {0,0,0,0,0,0,0,a0,a1,a2,a3,a4,a5,a6,a7,a8}.
Illustrated is the connected path for a5 to c9 to d12 for these settings.
FIG. 3a. 16x16 non-rotational barrel shifter (some connections removed). Note that a[i] inputs can be arbitrary width busses.

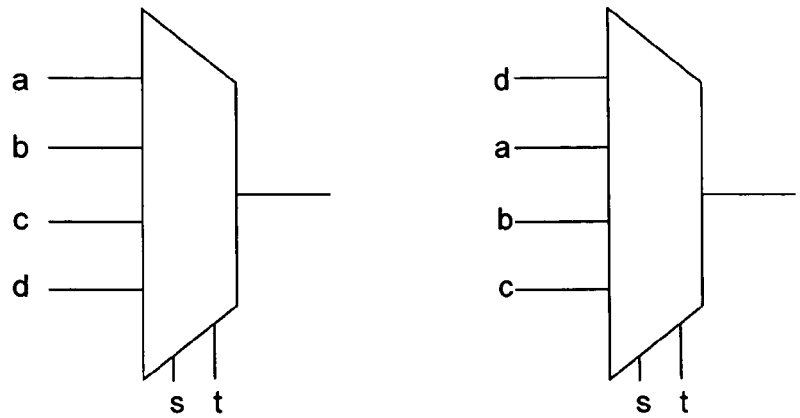
FIG. 4a. 4:1 muxes incompatible with SLM
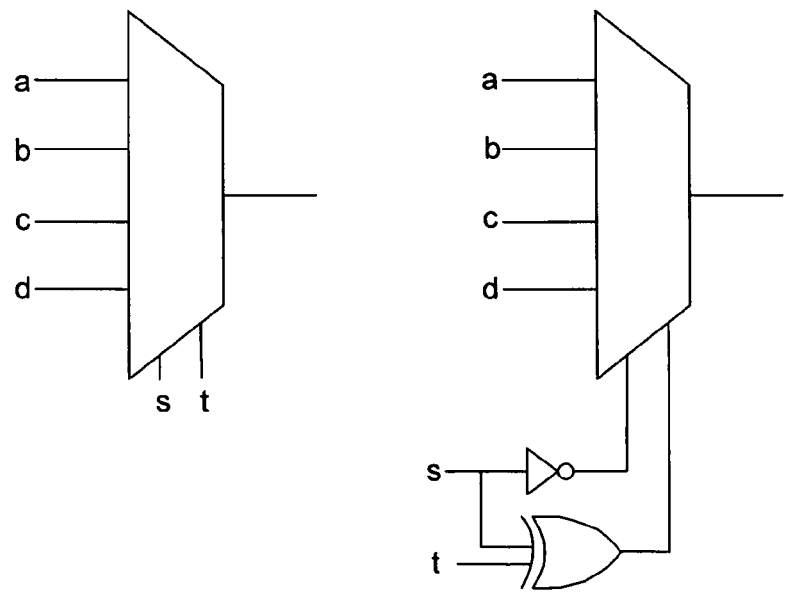
FIG. 4b. 4:1 muxes made compatible with manipulation of the select bits.

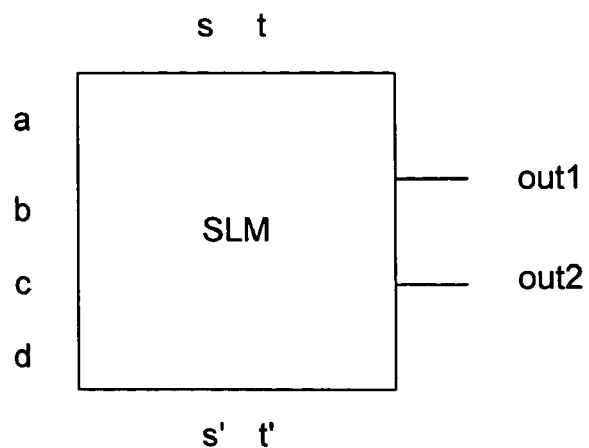
FIG. 5. Notation used to describe two 4:1 muxes with same data and different select lines implemented using SLM.

|  | "-12" | "-8" | "-4" | "0" |  | SLM PAIRS |
|---|---|---|---|---|---|---|
| c0 = mux( | a4, | a8, | a12, | a0; | s2, s1) | c0, c4 |
| c1 = mux( | a5, | a9, | a13, | a1; | s2, s1) | c1, c5 |
| c2 = mux( | a6, | a10, | a14, | a2; | s2, s1) | c2, c6 |
| c3 = mux( | a7, | a11, | a15, | a3; | s2, s1) | c3, c7 |
| c4 = mux( | a8, | a12, | a0, | a4; | s2, s1) |  |
| c5 = mux( | a9, | a13, | a1, | a5; | s2, s1) |  |
| c6 = mux( | a10, | a14, | a2, | a6; | s2, s1) |  |
| c7 = mux( | a11, | a15, | a3, | a7; | s2, s1) |  |
| c8 = mux( | a12, | a0, | a4, | a8; | s2, s1) | c8, c12 |
| c9 = mux( | a13, | a1, | a5, | a9; | s2, s1) | c9, c13 |
| c10 = mux( | a14, | a2, | a6, | a10; | s2, s1) | c10, c14 |
| c11 = mux( | a15, | a3, | a7, | a11; | s2, s1) | c11, c15 |
| c12 = mux( | a0, | a4, | a8, | a12; | s2, s1) |  |
| c13 = mux( | a1, | a5, | a9, | a13; | s2, s1) |  |
| c14 = mux( | a2, | a6, | a10, | a14; | s2, s1) |  |
| c15 = mux( | a3, | a7, | a11, | a15; | s2, s1) |  |

|  | "-3" | "-2" | "-1" | "0" |  |
|---|---|---|---|---|---|
| d0 = mux( | c13, | c14, | c15, | c0; | s2, s1) |
| d1 = mux( | c14, | c15, | c0, | c1; | s2, s1) |
| d2 = mux( | c15, | c0, | c1, | c2; | s2, s1) |
| d3 = mux( | c0, | c1, | c2, | c3; | s2, s1) |
| d4 = mux( | c1, | c2, | c3, | c4; | s2, s1) |
| d5 = mux( | c2, | c3, | c4, | c5; | s2, s1) |
| d6 = mux( | c3, | c4, | c5, | c6; | s2, s1) |
| d7 = mux( | c4, | c5, | c6, | c7; | s2, s1) |
| d8 = mux( | c5, | c6, | c7, | c8; | s2, s1) |
| d9 = mux( | c6, | c7, | c8, | c9; | s2, s1) |
| d10 = mux( | c7, | c8, | c10, | c10; | s2, s1) |
| d11 = mux( | c8, | c9, | c10, | c11; | s2, s1) |
| d12 = mux( | c9, | c10, | c11, | c12; | s2, s1) |
| d13 = mux( | c10, | c11, | c12, | c13; | s2, s1) |
| d14 = mux( | c11, | c12, | c13, | c14; | s2, s1) |
| d15 = mux( | c12, | c13, | c14, | c15; | s2, s1) |

FIG. 6. SLM pairings allowable with maniuplation of select bits.

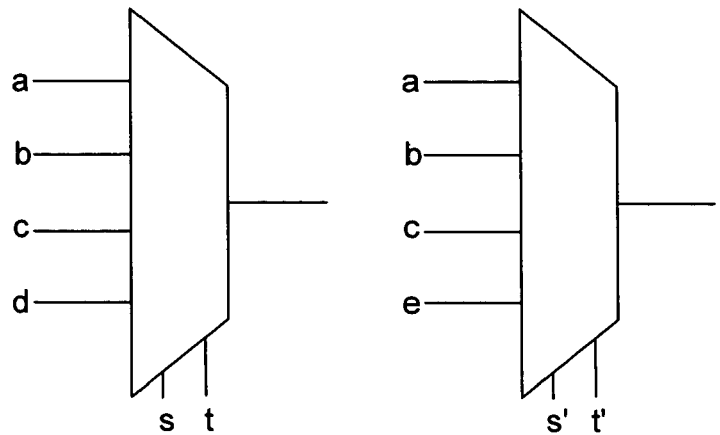
FIG. 7a. 4:1 muxes incompatible with SLM
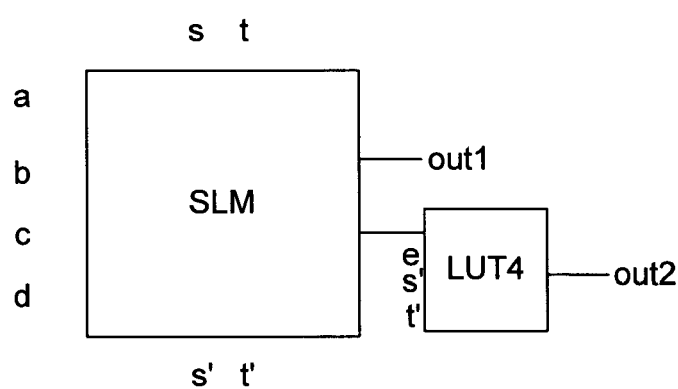
FIG. 7b. 4:1 muxes made compatible with a "repair" logic element.

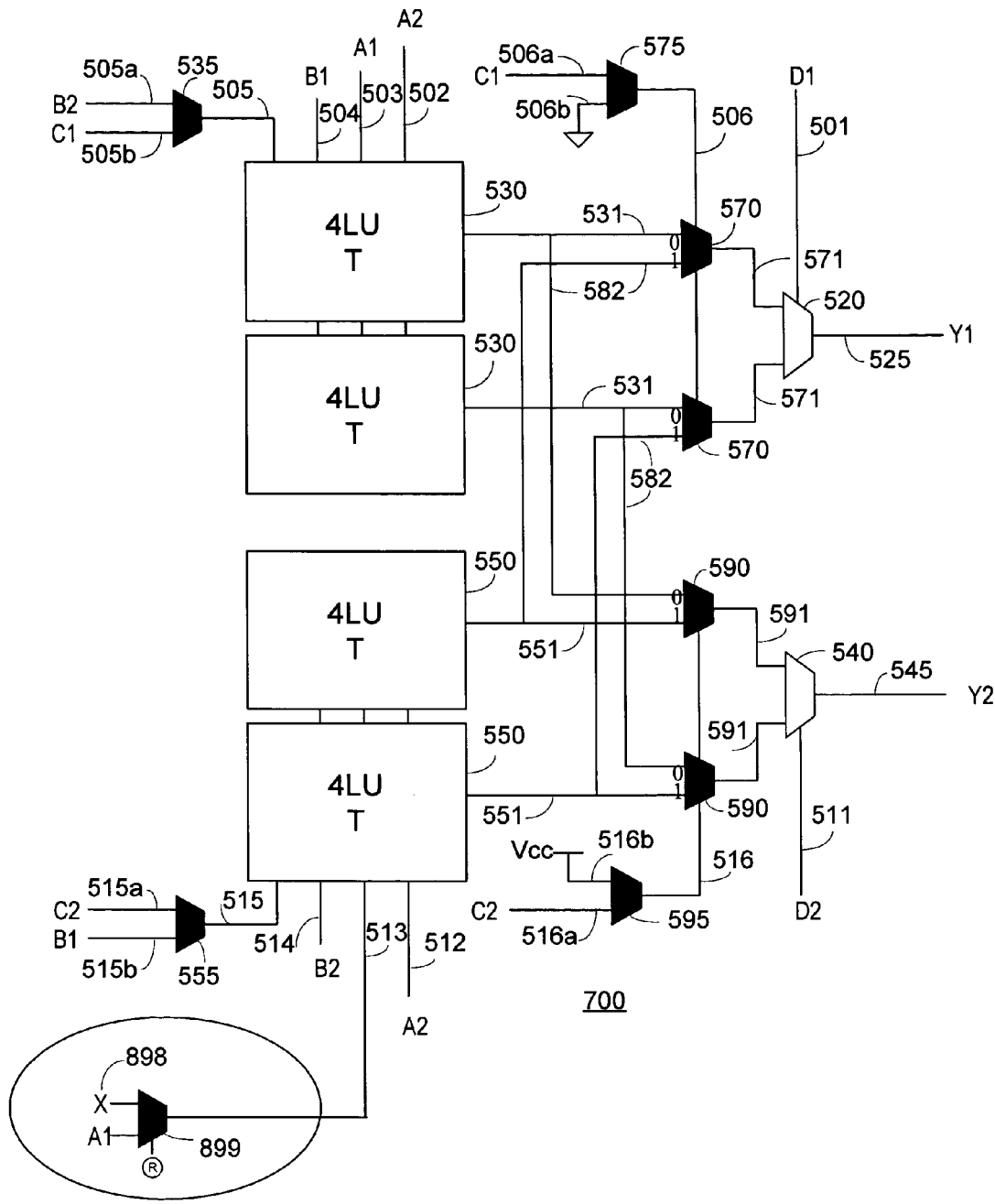
FIG. 8. Shared Lookup-Table Mapping Circuitry with Additional Input

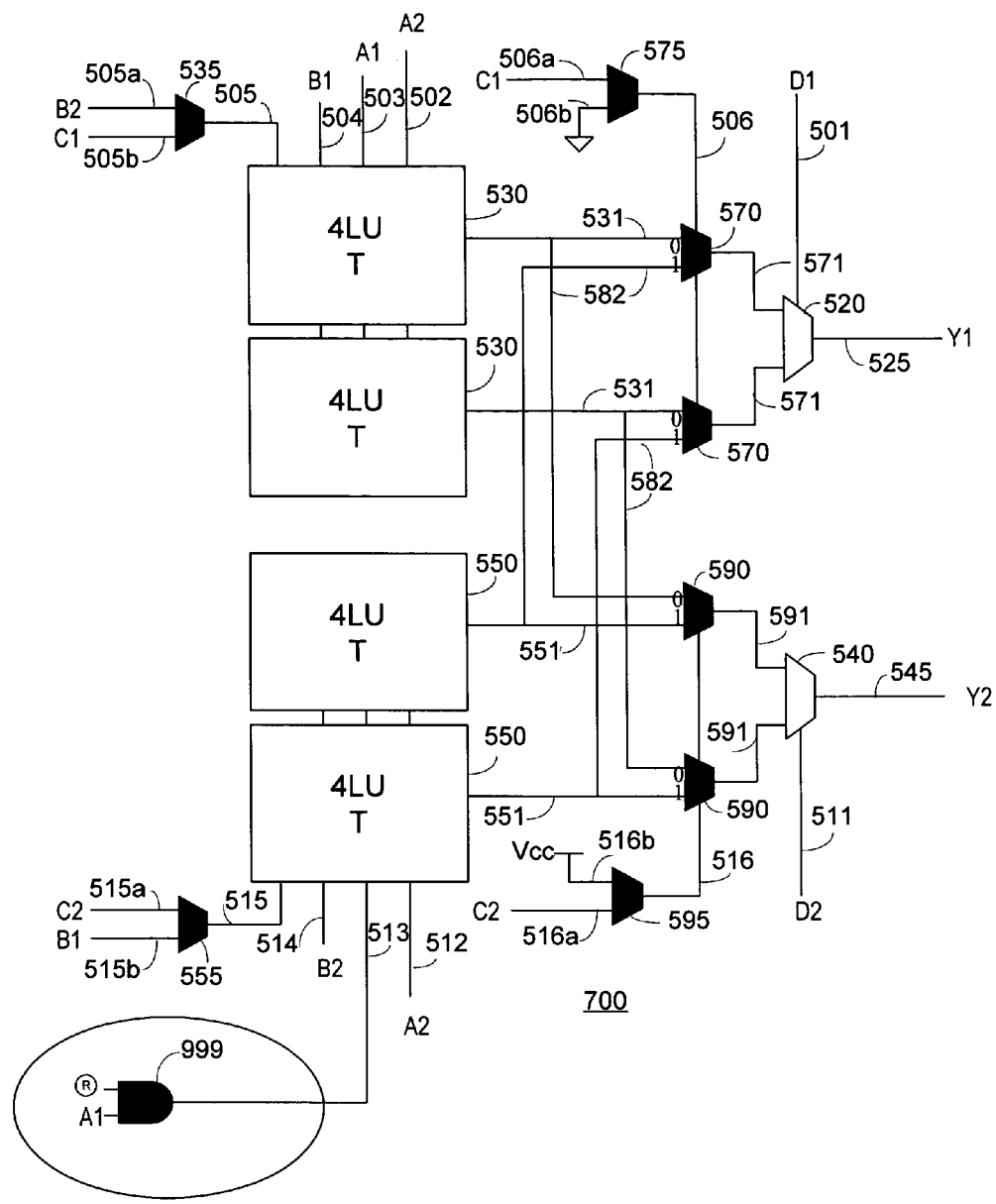
FIG. 9. Shared Lookup-Table Mapping Circuitry with Zero-able input

SHARED LOOKUP TABLE ENHANCEMENTS FOR THE EFFICIENT IMPLEMENTATION OF BARREL SHIFTERS

BACKGROUND OF THE INVENTION

The present invention relates to logic elements for use with programmable logic devices or other similar devices, and to enhancements for such devices specifically to make the implementation of hardware designs containing barrel shifters more efficient.

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. LABs also have common control signals which are called "secondary signals."

Logic elements, including look-up table (LUT)-based logic elements, typically include configurable elements holding configuration data that determines the particular function or functions carried out by the logic element. A typical LUT circuit may include ram bits that hold data (a "1" or "0"). However, other types of configurable elements may be used. Some examples may include static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "memory element" will be used to refer to any programmable element that may be configured to determine functions implemented by other PLD.

FIG. 10 illustrates a programmable logic device (PLD) 710 in a data processing system 700. As one example, the described logic circuits may be implemented in logic elements of PLDs such as PLD 710. PLD 710 includes a plurality of logic array blocks (LABs) such as LAB 712 (only one LAB is shown to avoid overcomplicating the drawing). LAB 712 includes a plurality of logic elements such as logic element 711 (only one logic element is shown to avoid overcomplicating the drawing). Data processing system 700 may include one or more of the following components: a processor 740; memory 750; I/O circuitry 720; and peripheral devices 730. These components are coupled together by a system bus 765 and are populated on a circuit board 760 which is contained in an end-user system 770.

System 700 can be used in a wide variety of applications, such as computer networking, data networking, instrumentation, video processing, digital signal processing, or any other application where the advantage of using programmable or reprogrammable logic is desirable. PLD 710 can be used to perform a variety of different logic functions. For example, programmable logic device 710 can be configured as a processor or controller that works in cooperation with processor 740 (or, in alternative embodiments, a PLD might itself act as the sole system processor). PLD 710 may also be used as an arbiter for arbitrating access to a shared resources in system 700. In yet another example, PLD 710 can be configured as an interface between processor 740 and one of the other components in system 700. It should be noted that system 700 is only exemplary.

A typical LUT circuit used as a logic element provides an output signal that is a function of multiple input signals. The particular logic function may be determined by programming the LUT's memory elements. As will be explained further herein (see FIG. 1 and accompanying text), a typical LUT circuit may be represented as a plurality of memory elements coupled to a "tree" of 2:1 muxes. (For compactness of illustration, the muxes shown in FIG. 1 are 4:1 muxes, and the 4:1 muxes include 2:1 muxes.) The LUT mux tree includes a first level comprising a single 2:1 mux providing the LUT output and also includes successive additional levels of muxes, each level including twice as many muxes as the previous level and the number of memory elements being twice as many as the number of 2:1 muxes in a last mux level coupled to the memory elements. Each 2:1 mux level provides a logic input to the LUT circuit coupled to control inputs of the muxes at that mux level. Thus, to obtain an n-input LUT (or "nLUT") typically requires $2^n$ memory elements and $2^n$ muxes. Adding an input to an nLUT circuit to provide an n+1 input LUT ("(n+1)LUT") therefore typically requires providing a total of $2^{n+1}$ memory elements and $(2^{n+1}-1)$ muxes, i.e., approximately a doubling of resources relative to that required by an nLUT.

For many applications, the functions that need to be implemented by a first LUT circuit and a second LUT circuit are identical. Also, for some applications, it may be possible for inputs of first and second LUT circuits to be shared without reducing the functionality required by the application. In such instances, opportunities are presented that need to be maximized for sharing resources to reduce the total number of memory elements and muxes that would otherwise be required.

Two specific types of functions which can take great advantage of such a method are cross-bar and barrel shifter circuitry. These functions conventionally consume large numbers of logic elements in a programmable logic device, and it would be very advantageous to reduce this logic.

In U.S. patent application Ser. No. 10/351,026 (the '026 application) filed Jan. 24, 2003, a method called "shared LUT mask" or SLM was described to make a more efficient FPGA logic element for logic functions which have large numbers of similar or identical functions. The SLM method works well for crossbars, and for some portions of barrel shifters, but it generally does not obtain further efficiency improvements on barrel shifters. The '026 application is incorporated herein in its entirety.

It would be desirable to apply the SLM method to improve the efficiency of barrel shifters for FPGAs.

SUMMARY

One aspect of the present invention provides additional circuitry over a shared-LUT logic circuit to allow functions of different input characteristics to share a logic element which was conventionally illegal.

A second aspect of this invention provides more restrictive circuitry over a shared-LUT logic circuit to allow functions with input characteristics.

This summary is not meant to be used to limit the claims or to be used to limit the disclosure of what the patent applicants consider to be the invention.

BRIEF DESCRIPTION OF THE DRAWINGS

The novel features of the invention are set forth in the appended claims. However, for purpose of explanation, several aspects of particular embodiments of the invention are described by reference to the following figures.

FIG. 1 illustrates a four-input lookup table circuit ("4LUT") and its implementation using a LUT-mask and tree of 4:1 mulitplexors.

FIG. 2 illustrates a shared LUT mask (SLM) implementation of a 6-input LUT with two additional LUTs. This particular structure is able to implement two 6-input functions which share 4 of their 6 inputs and which have an identical 64-bit LUT-mask.

FIG. 3 illustrates a 16×16 barrel shifter function implemented with 4:1 multiplexors. FIG. 3a shows the top-level diagram, and FIGS. 3b and 3c show generalizations of the first and second stage of the barrel shifter.

FIG. 4 shows a circuit for making some types of 4:1 multiplexors compatible with shared LUT-mask using auxiliary gates.

FIG. 5 shows notation used in this document for describing a pair of 4:1 muxes implemented using the circuit of FIG. 2 to share LUT masks.

FIG. 6 shows SLM pairs which are feasible for implementation in the circuit of FIG. 2 for the barrel shifter of FIG. 3 with the addition of the auxiliary gates of FIG. 4.

FIG. 7 illustrates the "repair LE" operation of the present invention which can be used in synthesis to improve the efficiency of barrel shifters using SLM.

FIG. 8 illustrates a hardware addition to the logic circuitry of SLM that allows an arbitrary additional input to replace one of the 4 identical inputs, allowing full efficiency of matching pairs of 6-input functions using SLM.

FIG. 9 illustrates a restriction of the logic circuitry of FIG. 8 that is less expensive in silicon cost, and provides less functionality—providing greater efficiency for non-rotational barrel shifters but not for rotational barrel shifters

DETAILED DESCRIPTION

Figure 10:
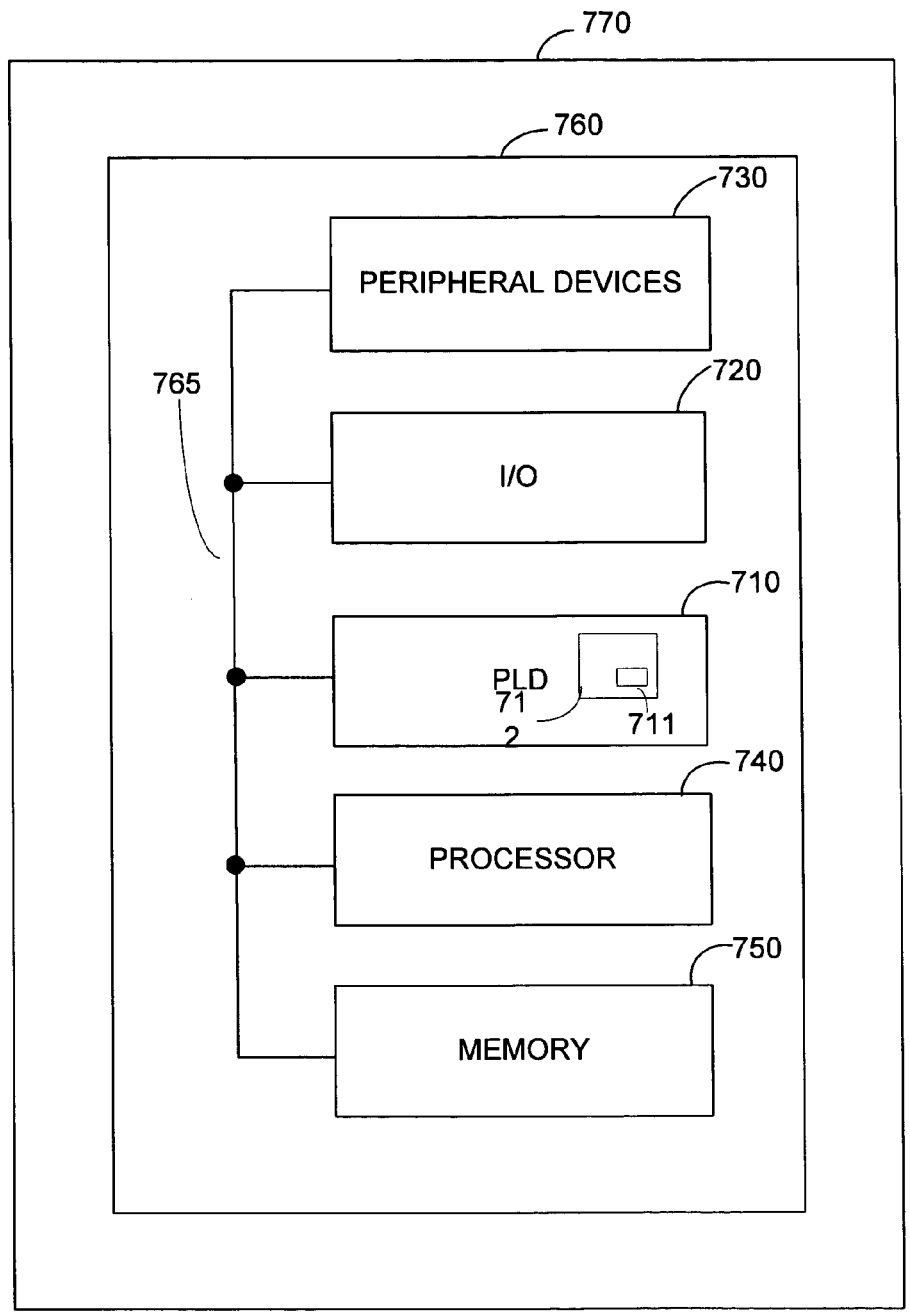
FIG. 10 illustrates a programmable logic device (PLD) in a data processing system 700.

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

FIG. 1 illustrates a four-input lookup-table circuit ("4LUT") 100. The design of the embodiment of the invention illustrated and described in subsequent figures and accompanying text may be understood as a modification and coupling of multiple LUTs by sharing the LUT-mask structure. Thus, an understanding of certain aspects of the structure of a LUT circuit is helpful to understanding the various embodiments of the invention illustrated in other figures herein. 4LUT 100 is a typical LUT circuit. 4LUT 100 comprises memory elements 109, 4:1 muxes 130, and 4:1 mux 120. Each memory element 109 can hold a data bit (1 or 0) and each is coupled to provide that bit to an input of a mux 130 as shown. Two control inputs of each mux 130 are coupled to, respectively, an input 104 and an input 103 of 4LUT 100 as shown. The output of each mux 130 is coupled to an input of mux 120 as shown. Two control inputs of mux 120 are coupled to, respectively, an input 102 and an input 101 of 4LUT 100 as shown. The output of mux 120 is coupled to provide output 105 of 4LUT 100.

Those skilled in the art will appreciate that a 4LUT such as 4LUT 100 can provide a complete function of four input signals. "Complete" in this context simply means that programming of memory elements 109 may be used to configure 4LUT 100 to perform any four-input function. E.g., 4LUT 100 may be configured (by programming its memory elements, e.g., loading values into those elements) so that the signal Y1 at output 105 is any one of a full range of logical functions of signals B1, A1, C1 and D1 provided at, respectively, inputs 104, 103, 102, 101 as will be appreciated by those skilled in the art.

The implementation of a LUT-based logic element is not limited to 4-input LUTs. LUTs based on 5 inputs, 6-inputs or larger can be implemented. However, the size of the LUT mask (memory elements 109) used grows with the number of inputs. A 5LUT uses 32 bits, a 6LUT 64 bits, and so on.

FIG. 2 illustrates logic circuit 500 in accordance with FIG. 5 of the '026 patent application incorporated by reference above. (The reference numerals used in FIG. 2 are the same as the reference numerals used in FIG. 5 of the '026 patent application.) Logic circuit 500 provides, depending on configuration, functionality of either two 5LUT circuits which may or may not implement the same function, or two 6LUT circuits which implement the same function, where "same function" means using the same LUT mask. As another alternative, logic circuit 500 may be configured to implement the functionality of two 4LUT circuits.

Specific pairs of functions which can be implemented using the circuitry of FIG. 2 are two 4:1 multiplexors that share the same LUT-mask and 4 inputs. These functions arise commonly from the automatic synthesis of digital functions using a CAD tool, because they efficiently implement CASE statements or IF statements arising from high-level language compilation, and because they arise from switching functions such as crossbars and barrel shifters.

Referring still to FIG. 2, first 5LUT circuitry includes 4LUTs 530 lines 531 and 571 and mux 520. Note that FIG. 2 just shows 4LUTs 530 as single "4LUT" blocks to avoid overcomplicating the drawing. As will be appreciated by those skilled in the art, 4LUTs 530 include memory elements and muxes not separately shown that are coupled together to provide 4LUT circuits comparable for example to the 4LUT circuit 100 of FIG. 1. The control input of mux 520 is coupled to first input 501. Control inputs of muxes in respective mux levels within each 4LUT 530 (muxes internal to 4LUTs 530 not separately shown) are coupled to respective second, third, fourth and fifth inputs 502, 503, 504, and 505. The output of mux 520 is coupled to provide output signal Y1 at output 525.

Second 5LUT circuitry includes 4LUTs 550 (memory elements and muxes coupled together to provide 4LUT circuits 550 not separately shown) lines 551 and 591 and mux 540. The control input of mux 540 is coupled to first input 511. Control inputs of muxes in respective mux levels within each 4LUT 550 (muxes internal to 4LUTs 530 not separately shown) are coupled to respective second, third, fourth and fifth inputs 512, 513, 514, and 515. The output of mux 540 is coupled to provide output signal Y2 at output 545.

Relative to output 525, input 501 may be said to be coupled to a control input of a mux at a first mux level of first 5LUT circuitry (note, in this instance, the first level comprises just one 2:1 mux). Input 502 may be said to be coupled to control inputs of muxes at a second mux level of first 5LUT circuitry (note, in this instance, the second level would comprise two 2:1 muxes: one 2:1 mux internal to each 4LUT 530—muxes internal to 4LUTs 530 not separately shown). Similarly, relative to output 545, input 511 may be said to be coupled to a control input of a mux at a first mux level of second 5LUT circuitry. Input 512 may be said to be coupled to control inputs of muxes at a second mux level of second 5LUT circuitry.

Additional circuitry includes muxes 570, muxes 590, and lines 582. Relative to the mux levels of first and second 5LUT circuitry, muxes 570 and 590 are interposed between a first and second mux level (more generally, between an "x" and "x+1" level). Outputs of 4LUTs 530 are respectively coupled to respective first inputs (labeled "0") of muxes 570 via respective lines 531 and to respective first inputs of muxes 590 via respective lines 582 as shown. Outputs of 4LUTs 550 are respectively coupled to respective second inputs (labeled "1") of muxes 590 via respective lines 551 and to respective second inputs of muxes 570 via respective lines 582 as shown. Outputs of muxes 570 are coupled to inputs of mux 520 via lines 571 and outputs of muxes 590 coupled to inputs of mux 540 via lines 591 as shown.

Control inputs of muxes 570 are coupled to a first additional input 506. Control inputs of muxes 590 are coupled to a second additional input 516. More generally, additional inputs 506 and 516 may be said to be "n+1th"inputs of respective (n+1) LUT circuitry provided by logic circuit 500.

Further additional circuitry includes muxes 535, 555, 575, and 595. The output of mux 535 is coupled to logic input 505 as shown. Mux 535 also includes inputs 505a and 505b which are coupled to receive, respectively, signals B2 and C1. The output of mux 555 is coupled to logic input 515 as shown. Mux 555 also includes inputs 515a and 515b which are coupled to receive, respectively, signals C2 and B1.

The output of low tie-off mux 575 is coupled to logic input 506. Mux 575 also includes inputs 506a and 506b. Input 506a is coupled to receive signal C1. Input 506b is coupled to ground as indicated by the downwardly pointing arrow. The output of high tie-off mux 595 is coupled to logic input 516. Mux 595 also includes inputs 516a and 516b. Input 516a is coupled to receive signal C2. Input 516b is coupled to Vcc.

Logic circuit 500 may be configured to operate in either a 5LUT ("nLUT") mode, a 4LUT ("(n−1)LUT"), or a 6LUT ("(n+1)LUT") mode as follows:

(i) 5LUT Mode ("nLUT")

To operate logic circuitry 500 in 5LUT mode, mux 575 is programmed to select input 506b which is coupled to ground; mux 595 is programmed to select input 516b which is coupled to Vcc; mux 535 is programmed to select input 505b which receives signal C1; and mux 555 is programmed to select input 515a which receives signal C2. In this mode, because input 506 is tied to ground and input 516 is tied to Vcc, muxes 570 all select their first inputs (labeled "0") and muxes 590 all select their second inputs (labeled "1"). In this mode, signals from lines 531 are passed to lines 571 and signals from lines 551 are passed to lines 591, effectively reducing circuitry 500 to the functionality of two independent 5LUT circuits with two inputs being shared across the two halves of circuit 500 (inputs 503 and 513 both receive signal A1 and inputs 502 and 512 both receive signal A2). In particular, in this mode, signal Y1 is a function of input signals C1, B1, A1, A2, and D1 and signal Y2 is a function of input signals C2, B2, A1, A2 and D2. The programming of memory elements 509 determines the particular function that Y1 is of the input signals C1, B1, A1, A2, and D1; and the programming of memory elements 319 determines the particular function that Y2 is of C2, B2, A1, A2 and D2. Thus, two distinct five-input functions may be provided.

(ii) 4LUT Mode ("(n−1)LUT")

To operate logic circuitry 500 in 4LUT mode, muxes 575, 595, 535 and 555 are programmed the same as just described above for 5LUT mode. As will be appreciated by those skilled in the art, memory elements in 4LUTs 530 and 4LUTs 550 (memory elements not separately shown) may be programmed to ignore one input for each half of circuitry 500. For example, memory elements in 4LUTs 530 may be programmed so that input signal A1 at input 503 is effectively ignored (i.e., the value of A1 would not affect the value of output signal Y1). Similarly, memory elements in 4LUTs 550 may be programmed so that input signal A2 at input 512 is also effectively ignored. In such an example, signal Y1 would then be a function of C1, B1, A2, and D1 and Y2 would be a function of C2, B2, A1, and D2. Thus, in this example, the functionality of two independent 4LUT circuits would be provided and no shared inputs would be required. As will be appreciated by those skilled in the art, in an alternative modification in which A2 were ignored at input 502 instead of A1 being ignored at input 503, then one shared input (503 and 513 coupled together) would exist for the two independent 4LUT functions.

(iii) 6LUT mode ("(n+1)LUT")

To operate circuitry 500 in the 6LUT mode, mux 575 is programmed to select input 506a which receives signal C1; mux 535 is programmed to select input 505a which receives signal B2; mux 595 is programmed to select input 516a which receives signal C2; and mux 555 is programmed to select input 515b which receives signal B13. In this mode, four inputs are shared across the two halves of the circuitry 500: inputs 505 and 514 both receive the same signal B2; inputs 504 and 515 both receive the same signal B1; inputs 503 and 513 both receive the same signal A1, and inputs 502 and 512 both receive the same signal A2. Thus, in this mode, circuitry 500 provides the functionality of two 6LUT circuits that may be configured to provide the same functions of six inputs, four of the inputs being shared across the two 6LUT circuits. In particular, in this mode, signal Y1 is a function of input signals B2, B1, A1, A2, C1, and D1 and signal Y2 is a function of input signals B1, B2, A1, A2, C2, and D2. The particular function implemented depends upon the programming of memory elements 509 and 519.

FIG. 3a illustrates a conventional barrel shifter circuit. The operation of a barrel shifter is to take the data input a0 to a15 (sixteen channels, in this example) and shift the data down by the number of bits encoded by the select signals {s3, s2, s1, s0}. For example, if the input is "abcdefghijklmnop" and the select lines 0101 (decimal 5) the resulting output should be "00000abcdefghijk". Not shown in this figure is a rotating barrel shifter. A rotating barrel shifter, rather than shifting O's into the output, rotates the shifted out data back to the top. The result of rotating the above input by five would be "lmnopabcdefghijk".

Barrel shifters are efficiently implemented using a logarithmic shifting network, as shown in FIG. 3a. In this case a 16-bit barrel shifter uses log4(16) or 2 "stages" of 4:1 multiplexors. FIGS. 3b and 3c illustrate the generalized behavior of 4:1 muxes of the first stage (FIG. 3b) and of the second stage (FIG. 3c). In the first stage, the data is shifted down 0, 4, 8 or 12 bits, depending on s3 and s2. In the second stage, data is shifted by 0, 1, 2 or 3 bits depending on s1, s0. Shown in dashed lines in FIG. 3 is the behavior of data line a5 when the select lines are 0111: stage 1 shifts a5 down 4 units to c9, and stage 2 shifts c9 3 units to d12, so the data present at a5 will exit as d12 in the output, shifted by 7 units which is the decimal equivalent of 0111.

FIGS. 3b and 3c illustrate the generalized behavior of 4:1 muxes of the first stage (FIG. 3b) and second stage (FIG. 3c).

To build an equivalent barrel shifter with 2:1 muxes, one would have twice the number of stages, and each stage would shift by 1, 2, 4, 8, 16, etc. bits counting backwards from the end.

In general, barrel shifters are of any width. In the case of a 64-bit barrel shifter, there are 64 data inputs and 64 data outputs—3 stages of 4:1 muxes. It is very common also for the data inputs to be busses (vectors of data) rather than single bit quantities. Were the barrel shifter of FIG. 3a to have busses of width 32, there would be 32 identical copies of the FIG. 3a barrel shifter, one for each bit of the data-width.

A barrel shifter has properties of a crossbar circuit. A crossbar differs from a barrel shifter in that a crossbar has a different set of select signals for every data-output di, rather than shared select signals. Though the function is different, crossbars share with barrel shifters the property of generating many 2:1 or 4:1 multiplexors when created in synthesis.

The number of logic elements used to implement barrel shifters and crossbars can be large. In the case of the 16-bit barrel shifter with data-width 32 just described, 16*2 multiplexors are used for each bit of the data width, in total 1024 4:1 muxes. In an FPGA which has a 4LUT logic element (FIG. 1), this would be 2048 logic elements to implement the function. In an FPGA which has a 6LUT logic element, which can implement a 4:1 mux by itself, this would be 1024 logic elements. A 16-bit crossbar uses five 4:1 muxes for each di over 32 bits of data-width and 16 channels for a total of 2560 4:1 muxes (5120 4LUT or 2560 6LUT logic elements, respectively).

It can be appreciated, then, that making these implementations more efficient is highly desired. The SLM circuitry shown in FIG. 2 (and described in the '026 patent application) partially fulfills this goal. Whenever two 4:1 muxes have the same 4 data-lines, but possibly different select lines, they can be paired using SLM and, so, are compatible. For example, mux(a,b,c,d; s,t) and mux(a,b,c,d; s,t,) denote two 4:1 muxes that can be paired using SLM. In the case of crossbars, it is almost always possible to find pairings of multiplexors that match. But the data lines typically do not match in the case of barrel shifters, due to the shifting nature.

On the other hand, FIG. 4a shows a common structure of 4:1 muxes which "almost" match, but do not quite match, the SLM template. FIG. 4b illustrates an "auxiliary" circuitry useful to facilitate matching the two multiplexors. In some sense, it is inefficient to spend two 4LUT logic elements to merge two 6LUTs using SLM on one bit. However, in the case of multi-bit, multi-width barrel shifters, this cost is amortized over all other pairings which use that same manipulation.

FIG. 6 illustrates the effectiveness of the SLM for pairing 4:1 muxes, using the example of FIG. 3a and the auxiliary logic illustrated in FIG. 4b. Multiplexors c0 and c4 from FIG. 3a are directly implementable with SLM circuitry. This applies to all data-width multiplexors of the same form. In fact, all multiplexors in the first stage of the barrel shifter can be paired perfectly, both for rotational and non-rotational barrel shifters, saving 256 of the 1024 multiplexors. The second stage does not allow any SLM pairings. Thus SLM allows about a total 25% reduction in logic elements to implement the 16×16×32 barrel shifter.

The lines drawn in FIG. 6 indicate that the data inputs for the entries above and to the left of the lines are for rotational barrel shifters, and would be constant 0 in the non-rotational (shifting) barrel shifter. In the shifting case, though SLM pairings are not possible, this issue can be "most often" addressed from the fact that the functions are no longer 4:1 multiplexors because the 4:1 multiplexors with some constant inputs are 5-input functions or less, and the logic element of FIG. 2 allows two 5LUT functions to be packed in the same logic element without use of SLM.

Further embodiments of this invention, seek to further improve the efficiency of barrel shifters is further improved, primarily by making modifications to the SLM circuitry illustrated in FIG. 2, to provide greater pairing of 4:1 multiplexors using SLM.

FIG. 7a shows one specific "close" pairing arising in the second stage of a 16-bit multiplexor. It does not match the template because the "e" input of the rightmost mux is not present in the leftmost mux. So, even the auxiliary circuitry of FIG. 4b will not facilitate a match.

In accordance with one aspect, the barrel shifter is synthesized in software. The logic element of FIG. 2 allows implementation of either one 6LUT function or two 4LUT functions, so a 4LUT can be considered as "one half" of a logic element. The 4:1 muxes of FIG. 7a are paired for SLM. (FIG. 5 illustrates a notation of input, select and output signals relative to SLM.) Whenever the select lines s't' are 11, the result will be incorrect. In all other cases, the result is correct. To address this error, a second 4LUT is inserted on the output of the bottom-most-mux, as shown in FIG. 7b, and the errant "d" output is replaced with "e" when s 't' is 11, giving the correct output at out2.

The savings from this modified circuitry are that all the un-matched 4:1 muxes of FIG. 6 are paired, saving an additional 256 logic elements. However, 256 4LUT repair structures are also used, so the savings is 256 ½ logic elements total, or 12.5% of the LEs in the original non-SLM barrel shifter.

FIG. 8 shows a further embodiment, which is an alternative solution in hardware. The multiplexor 899 is added, and additional input 898 is added, which can replace the A1 input of the original FIG. 2 diagram. This also allows all of the structures in the second stage of barrel shifter of FIG. 3a. The input X can be taken from any nearby location in the programmable interconnect fabric. For example, it can be "stolen" from a programmable clock connection, a cluster-local or "LAB" line, or directly from a horizontal or vertical global interconnect line.

Though savings for the software "repair LE" solution can be evaluated, the savings are unclear for the hardware modification. The hardware cost, though small, applies to all logic elements in the programmable logic device. However, the gains apply only to particular user functions which include barrel shifters as sub-functions.

A further embodiment is shown in FIG. 9. In this embodiment, a 2:1 multiplexor with a constant input 0 is inserted, rather than an arbitrary input X. This halves the cost, but it does not address the general problem. Pairs of muxes shown in FIG. 7a cannot be subjected to SLM when the rightmost mux has data inputs {a,b,c,e}. However, SLM can be accomplished when the rightmost mux has data-inputs {a,b, c,0}—i.e., a constant zero, as arising in a non-rotational barrel shifter. Thus, for one half the implementation cost, the full SLM pairings can be achieved for 3 of the remaining 8 possible pairings, or slightly less than 12.5% total. This can be combined with the software repair BLE to achieve further savings.

Although particular embodiments have been described in detail, various modifications to the embodiments described herein may be made without departing from the spirit and scope of the present invention, thus, the invention is limited only by the appended claims.

The claimed invention is:

1. A look-up table (LUT) based logic element (LE), comprising:
   m data inputs;
   two data outputs;
   2 k bits of LUT mask,
   wherein
   the LE includes first and second circuitry configured to accomplish first and second respective identical Boolean functions, each of the first and second circuitry operating on k data inputs responsive to a separate 2 k−1 bits of the 2 k bits of LUT mask, wherein 2 k−m inputs of the m inputs are shared between the first and second circuitry and m−k inputs of each k inputs are independent inputs;
   m=k+2;
   each of the first and second circuitry includes base circuitry comprising a plurality of multiplexor stages to nominally accomplish a k−1 LUT function operating responsive to the separate 2 k−1 bits of the 2 k bits of LUT mask;
   each of the first and second circuitry further includes an additional stage inserted between a first, earlier, multiplexor stage and a second, later, multiplexor stage of the base circuitry, the additional stage of each of the first and second circuitry configured to selectively pass the outputs from the earlier stage of that circuitry or from the earlier stage of the other circuitry, to the later stage of that circuitry,
   the first and second circuitry thereby collectively forming two k input LUT functions with no additional LUT mask bits beyond the $2^k$ bits of LUT mask; and
   the LE further comprises an SRAM-controlled 2:1 mux whose output provides an (m+1)st data input, wherein the 2:1 mux selects between a signal provided at one of the m data inputs and a signal that is not provided at one of the m data inputs.

2. The LE of claim 1, wherein:
   the LUT-based LE is within a logic array block (LAB); and
   the signal that is not provided at one of the m data inputs is a tap line from the secondary signals for the LAB.

3. The LE of claim 1, wherein:
   the LUT-based LE is within a logic array block (LAB); and
   the signal that is not provided at one of the m data inputs is a tap line from the general routing resources of the LAB.

4. The LE of claim 1, wherein:
   the signal that is not provided at one of the m data inputs is zero or ground.

5. The LE of claim 4, wherein:
   the SRAM-controlled 2:1 mux is implemented as an AND gate.

6. The LE of claim 1, wherein the LUT-based LE implements two multiplexer elements of a crossbar or barrel shifter network.

7. The LE of claim 6, wherein:
   the shared inputs constitute the data bits two two compatible muxes and the independent inputs constitute distinct select bits to the two compatible muxes.

8. The LE of claim 7, further comprising:
   circuitry to transform the select bits to one of the two compatible muxes to effectively rotate the data bits to that one compatible mux to align with the data bits to the other of the two compatible muxes.

9. The LE of claim 2, wherein:
   the (m+1)st data input is used to replace a data input to one of the pair of LUT circuits.

10. The LE of claim 3, wherein:
    the (m+1)st data input is used to replace a data input to one of the pair of LUT circuits.

11. The LE of claim 4, wherein:
    the (m+1)st data input is used to replace a data input to one of the pair of LUT circuits.

12. A method of generating a design configuration for an LE, comprising:
    processing design language representing a barrel shifter; and
    generating a design configuration for the LE of claim 8.

13. A method of generating a design configuration for an LE, comprising:
    processing design language representing a barrel shifter; and
    generating a design configuration for the LE of claim 9.

14. A method of generating a design configuration for an LE, comprising:
    processing design language representing a barrel shifter, and
    generating a design configuration for the LE of claim 10.

15. A method of generating a design configuration for an LE, comprising:
    processing design language representing a barrel shifter, and
    generating a design configuration for the LE of claim 11.

* * * * *